(12) United States Patent
Parkinson et al.

(10) Patent No.: US 7,808,807 B2
(45) Date of Patent: Oct. 5, 2010

(54) METHOD AND APPARATUS FOR ACCESSING A MULTI-MODE PROGRAMMABLE RESISTANCE MEMORY

(75) Inventors: Ward Parkinson, Boise, ID (US); Stefan Lai, Woodside, CA (US)

(73) Assignee: Ovonyx, Inc., Rochester Hills, MI (US)

( * ) Notice: Subject to any disclaimer, the term of this patent is extended or adjusted under 35 U.S.C. 154(b) by 247 days.

(21) Appl. No.: 12/075,665

(22) Filed: Mar. 13, 2008

(65) Prior Publication Data

US 2009/0213645 A1   Aug. 27, 2009

Related U.S. Application Data

(63) Continuation-in-part of application No. 12/072,411, filed on Feb. 26, 2008.

(51) Int. Cl.
*G11C 5/06* (2006.01)

(52) U.S. Cl. .................................... 365/63; 365/163
(58) Field of Classification Search .............. 365/63, 365/163, 158
See application file for complete search history.

(56) References Cited

U.S. PATENT DOCUMENTS

2004/0264237 A1* 12/2004 Perner .................... 365/158

* cited by examiner

*Primary Examiner*—Son Dinh
(74) *Attorney, Agent, or Firm*—Kevin L. Bray

(57) ABSTRACT

A memory is configurable among a plurality of operational modes and types of interfaces. The operational modes may dictate the number of storage levels to be associated with each cell within the memory's storage matrix. Individual operational modes may be matched to individual interfaces, operated one at a time or in parallel.

22 Claims, 6 Drawing Sheets

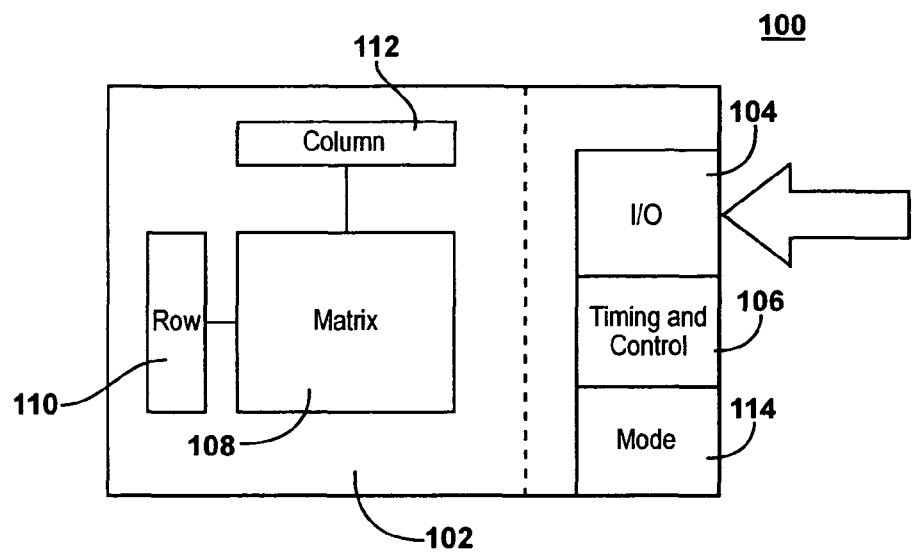
FIG - 1
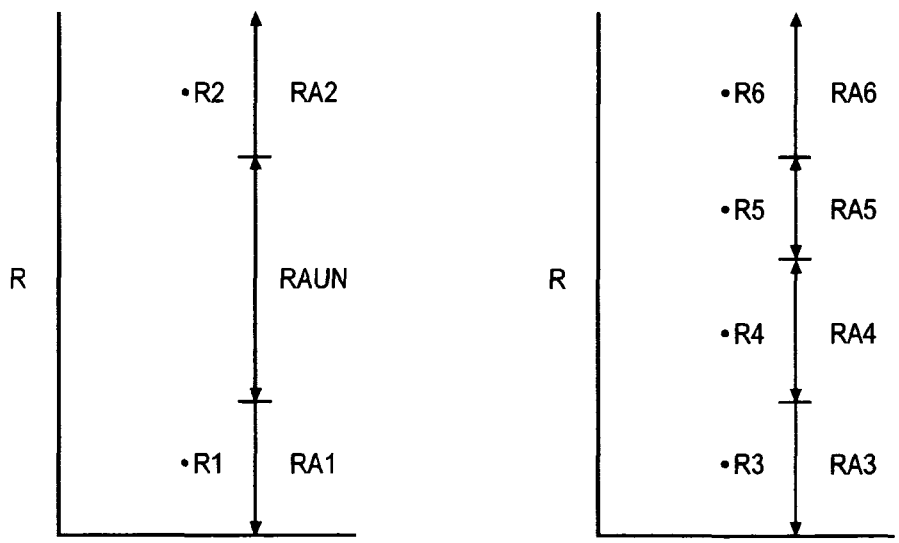
FIG - 3A  FIG - 3B

| Comparator Values | | | | Logic Values | |
|---|---|---|---|---|---|
| Comp 1 | Comp 2 | Comp 3 | R | Binary | Quaternary |
| Lo | Lo | Lo | R1/R3 | 0 | 00 |
| Hi | Lo | Lo | R4 | 0 (Undefined) | 01 |
| Hi | Hi | Lo | R5 | 0 (Undefined) | 10 |
| Hi | Hi | Hi | R2/R6 | 1 | 11 |

METHOD AND APPARATUS FOR ACCESSING A MULTI-MODE PROGRAMMABLE RESISTANCE MEMORY

CROSS-REFERENCE TO RELATED APPLICATIONS

This application is a continuation in part and claims benefit of a U.S. patent application having Ser. No. 12/072,411 filed Feb. 26, 2008, entitled "METHOD AND APPARATUS FOR ACCESSING A MULTI-MODE PROGRAMMABLE RESISTANCE MEMORY," and having Ward Parkinson as the inventor, which is hereby incorporated by reference.

FIELD OF INVENTION

This invention pertains to accessing programmable resistance memories. More particularly, this invention relates to reading from and writing to a programmable resistance memory device.

BACKGROUND OF THE INVENTION

Programmable resistance memories include a variety of memories, one of which is the phase-change memory. Phase-change memory arrays are based upon memory elements that switch among two material phases, or gradations thereof, to exhibit corresponding distinct electrical characteristics. Alloys of elements of group VI of the periodic table, such as Te, S or Se, referred to as chalcogenides or chalcogenic materials, can be used advantageously in phase change memory cells. In the chalcogenides, the resistivity varies by two or more orders of magnitude when the material passes from the amorphous (more resistive) phase to the crystalline (more conductive) phase, and vice versa. In the amorphous state, moreover, the resistivity depends on the temperature.

A chalcogenide memory device may utilize the wide range of resistance values available for the material as the basis of memory operation. Each resistance value corresponds to a distinct structural state of the chalcogenide material and one or more of the states can be selected and used to define operation memory states. Chalcogenide materials exhibit a crystalline state, or phase, as well as an amorphous state, or phase. Different structural states of a chalcogenide material differ with respect to the relative proportions of crystalline and amorphous phase in a given volume or region of chalcogenide material. The range of resistance values is generally bounded by a set state and a reset state of the chalcogenide material. By convention, the set state is a low resistance structural state whose electrical properties are primarily controlled by the crystalline portion of the chalcogenide material and the reset state is a high resistance structural state whose electrical properties are primarily controlled by the amorphous portion of the chalcogenide material.

Phase change may be induced by increasing the temperature locally. Below 150° C., both of the phases are stable. Above 200° C., there is a rapid nucleation of the crystallites and, if the material is kept at the crystallization temperature for a sufficiently long time, it undergoes a phase change and becomes crystalline. To bring the chalcogenide back to the amorphous state it is necessary to raise the temperature above the melting temperature (approximately 600° C.) and then cool it off rapidly, i.e. quench. From the electrical standpoint, it is possible to reach the crystallization and melting temperatures by causing a current to flow through a crystalline resistive element that heats the chalogenic material by the Joule effect.

Each memory state of a chalcogenide memory material corresponds to a distinct resistance value and each memory resistance value signifies unique informational content. Operationally, the chalcogenide material can be programmed into a particular memory state by providing an electric current pulse of an appropriate amplitude and duration to transform the chalcogenide material into the structural state having the desired resistance. By controlling the amount of energy provided to the chalcogenide material, it is possible to control the relative proportions of crystalline and amorphous phase regions within a volume of the material and to thereby control the structural (and corresponding memory) state of the chalcogenide material to store information.

Each memory state can be programmed by providing the current pulse characteristics of the state and each state can be identified, or "read", in a non-destructive fashion by measuring the resistance. Programming among the different states is fully reversible and the memory devices can be written and read over a virtually unlimited number of cycles to provide robust and reliable operation. The variable resistance memory functionality of chalcogenide materials is currently being exploited in the OUM (Ovonic Universal (or Unified) Memory) devices that are beginning to appear on the market. Basic principles and operation of OUM type devices are presented, for example, in U.S. Pat. Nos. 6,859,390; 6,774,387; 6,687,153; and 6,314,014; the disclosures of which are incorporated by reference herein, as well as in several journal articles including, "Low Field Amorphous State Resistance and Threshold Voltage Drift in Chalcogenide Materials," published in EE transactions on Electron Devices, vol. 51, p. 714-719 (2004) by Pirovana et al.; and "Morphing Memory," published in IEEE Spectrum, vol. 167, p. 363-364 (2005) by Weiss.

The behavior (including switching, memory, and accumulation) and chemical compositions of chalcogenide materials have been described, for example, in the following U.S. Pat. Nos. 6,671,710; 6,714,954; 6,087,674; 5,166,758; 5,296,716; 5,536,947; 5,596,522; 5,825,046; 5,687,112; 5,912,839; and 3,530,441, the disclosures of which are hereby incorporated by reference. These references present proposed mechanisms that govern the behavior of chalcogenide materials. The references also describe the structural transformations from the crystalline state to the amorphous state (and vice versa) via a series of partially crystalline states in which the relative proportions of crystalline and amorphous regions vary during the operation of electrical and optical programming of chalcogenide materials.

A wide range of chalcogenide compositions has been investigated in an effort to optimize the performance characteristics of chalcogenic devices. Chalcogenide materials generally include a chalcogen element and one or more chemical or structural modifying elements. The chalcogen element (e.g. Te, Se, S) is selected from column VI of the periodic table and the modifying elements may be selected, for example, from column III (e.g. Ga, Al, In), column IV (e.g. Si, Ge, Sn), or column V (e.g. P, As, Sb) of the periodic table. The role of modifying elements includes providing points of branching or cross-linking between chains comprising the chalcogen element. Column IV modifiers can function as tetracoordinate modifiers that include two coordinate positions within a chalcogenide chain and two coordinate positions that permit branching or crosslinking away from the chalcogenide chain. Column III and V modifiers can function as tricoordinate modifiers that include two coordinate positions within a chalcogenide chain and one coordinate position that permits branching or crosslinking away from the chalcogenide chain. Embodiments in accordance with the principles of the present invention may include binary, ternary, quaternary, and higher order chalcogenide alloys. Examples of chalcogenide materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein. Chalcogenide materials may also be the resultant of a reactive sputtering process with gasses such as N2 or O2: forming a chalcogenide nitride, or oxide, for example and chalcogenide may be modified by an ion implantation or other process.

Although programmable resistance memories, such as OUM-based memories, can address the demands of a variety of applications, the optimal solution for one set of specifications may be at odds with the performance of such a memory in another application. For example, the demand for high speed operation in some applications may work at cross-purposes with the requirement for high density storage in other applications. A memory that can accommodate the demands of high speed operation and high density storage would therefore be highly desirable.

SUMMARY OF THE INVENTION

A memory in accordance with the principles of the present invention is configurable among a plurality of operational modes. Each mode may have associated with it unique writing and/or reading characteristics and/or interface protocols (provided either on-chip or off-chip by a controller). Generally, when reference is made to "a memory" herein, we are discussing an individual integrated circuit memory, which will also be referred to as a "memory chip" or, simply, as a "chip" herein.

In an illustrative embodiment, a memory may be configured to program a memory cell within the memory to one of a predetermined number of states in one mode and to program the same cell to one of a different predetermined number of states in another mode. For example, this may provide one logical bit per physical cell with one programming mode, or two (or more) logical bits per cell in another mode. Each mode may use the same or a different factory or customer selectable interface; e.g. Dram, Nand, Nor, SSD, USB, or SD Card. Because those modes that feature a greater number of states may require more time to read or write, the memory or a section of the memory may be configured to operate with a lower number of states for applications that require higher speeds or more margin (such as for better data retention or higher temperature operation. For applications in which speed is not so critical, and higher density is desired, the same memory may be configured to operate in a mode that provides higher-density, lower-speed operation.

In an illustrative embodiment, at least one programming mode includes four or more program states and one programming mode includes two program states. All, or part, of the memory may be configured to operate in either of the modes.

A memory in accordance with the principles of the present invention may include one or more standard interfaces that may be configured to provide access to the multi-mode memory for external circuitry. Some of such interfaces may be unused on a particular chip or during some operations of a chip. Or such interfaces may be operated in parallel, with one interface driven by part or all of a layer and another interface driven by another part of the layer, all of one layer, or more than one layer. The choice of alloy and/or its electrodes, its processing, and the select device (diode, transistor, or OTS (Ovonic Threshold Device) in series with alloy may vary for a portion or one layer, one of several layers, or more than one of several layers.

BRIEF DESCRIPTION OF THE DRAWINGS

FIG. 1 is a conceptual block diagram of phase change memory in accordance with the principles of the present invention;

FIGS. 3A and 3B are resistance to logic level mapping diagrams, respectively, for binary and quaternary operational modes in accordance with the principles of the present invention;

DETAILED DESCRIPTION

Figure 2:
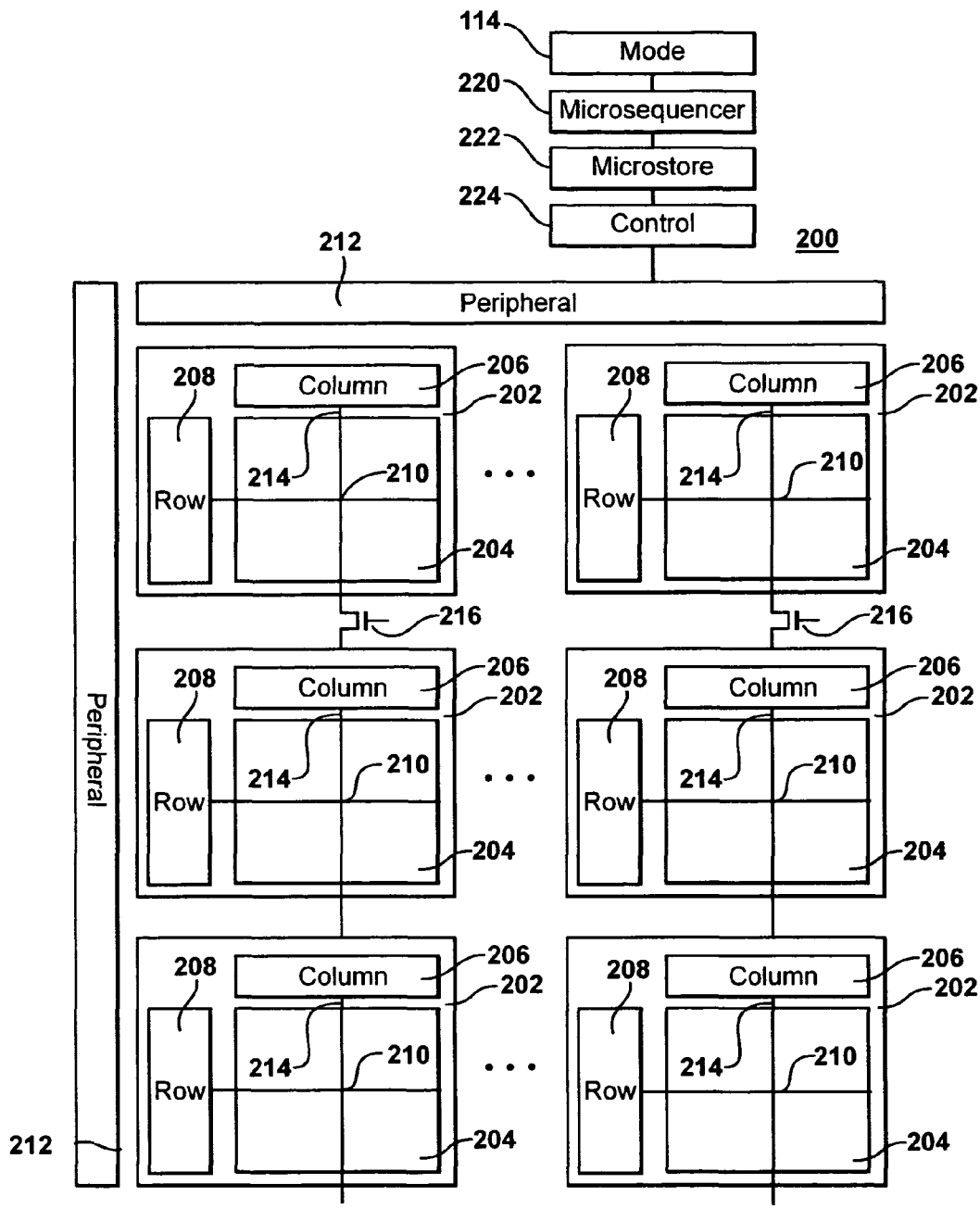
FIG. 2 is a conceptual block diagram of a programmable resistance memory in accordance with the principles of the present invention, with a more detailed view of mode control circuitry utilized in an illustrative embodiment of such a memory.

Although this invention will be described in terms of certain preferred embodiments, other embodiments that are apparent to those of ordinary skill in the art, including embodiments that do not provide all of the benefits and features set forth herein, are also within the scope of this invention. Various structural, logical, process step, chemical, and electrical changes may be made without departing from the spirit or scope of the invention. Accordingly, the scope of the invention is defined only by reference to the appended claims.

As illustrated in the conceptual block diagram of FIG. 1, a memory 100 in accordance with the principles of the present invention includes a memory array 102, input/output (I/O) circuitry 104, and control and timing circuitry 106. The memory array 102 includes a cross-point matrix 108 of memory cells and row 110 and column 112 drivers. The input/output circuitry 104 includes drivers for transmitting signals to circuitry outside the memory array 102, and for receiving signals from circuitry outside the memory array 102. Circuitry outside the memory array for which the input/output 104 circuitry provides an interface may share the same integrated circuit as the memory array 102 or may be located on another "chip." The timing and control circuitry 106 includes mode control circuitry 114.

In accordance with the principles of the present invention, the mode control circuitry may be operated to configure the memory 100 among a plurality of operational modes. Each mode may have associated with it unique writing and/or reading characteristics. In an illustrative embodiment, the memory 100 may be configured to program a memory cell within the memory to one of a predetermined number of logic states in one mode and to program the same cell to one of a greater number of logic states in another mode. The entire memory 100 or a section of the memory (more specifically, the matrix 108) may be configured to operate with a lower number of states for applications that require higher speeds. For applications in which speed is not so critical and higher density is desired, the same memory 100 (more specifically, the matrix 108), or a portion thereof, may be configured to operate in a mode that provides higher-density, lower-speed operation.

In the illustrative embodiment of FIG. 2, a multi-mode memory in accordance with the principles of the present invention includes memory access circuitry configured to write data to and read data from a phase-change memory array 200. Phase change memory arrays are known and may be organized, for example, as hierarchical memories. The memory array 200 may include phase change memory cells arranged in a two-dimensional matrix, with row (also referred to as wordline) and column (also referred to as bitline) decoder and driver transistor devices and row and column interconnect conductors, for example. Phase change memory arrays are known and discussed, for example, in U.S. Pat. No. 6,813,177 issued to Lowrey et al, which is hereby incorporated by reference.

Within each block of memory, ADDRESS DECODE, READ, WRITE, and DATA signals are used to determine which cell to access and which operation to perform on the accessed cell. A memory in accordance with the principles of the present invention may employ different current/voltage sources for each operation (e.g., READ, WRITE 00, WRITE 01, WRITE 10, WRITE 11, etc.) or may reconfigure the same sources to perform the variety of access operations. The memory, more particularly in this illustrative embodiment, the control circuitry 224, predetermines not just whether the cell is to be read from or written to, but, additionally, if it is being written to, what state the cell is to be written to. Such operations are described in greater detail below.

The access circuitry includes address, data, and read/write decode circuitry that determines, in response to input from circuitry accessing the memory, what operation (i.e. READ, WRITE 01, WRITE 10, WRITE 11, etc.) will be performed upon what cell within the memory 200. In this illustrative embodiment, mode control circuitry 114 accepts one or more input signals, which could be in the form of nonvolatile memory, an activated fuse or anti-fuse or other mechanism, and controls the memory's mode of operation according to the value of the signal input to the mode control circuitry 114. In this illustrative embodiment, the control circuitry 114 operates on a micro-sequencer 220 to alter the sequencer's path through a micro-instruction store 222; the chosen path being associated with a mode of operation stored in the mode control circuitry 114. The micro-instruction store, in turn, operates on control circuitry 224 to effect the execution of accesses to the memory array 200.

A memory in accordance with the principles of the present invention may employ a hierarchical architecture in which blocks of memory are distributed in an array. In an illustrative embodiment, each block of memory and each bit within the block may be accessed through row and column address buffers and decoders. Information (data or control code, for example) targeted for writing to memory cells within the array may be stored within data buffers then written to the cells in a manner described in greater detail below. Sense amplifiers may be employed to read information from memory cells within the array and to then store the information in data buffers for presentation through input/output circuitry "off-memory."

Decoded addresses, in combination with signals such as READ, WRITE, and data values such as 00, 01, 10, and 11, may be employed to route the appropriate current source to a selected memory cell. In accordance with the principles of the present invention, the state of the mode selection circuit 114 determines in which of a variety of modes the memory 200 will operate. As previously described, the state of the mode selection circuit 114 may be set by activating a fuse or an anti-fuse, for example. Such a mode-selection process may take place during manufacturing, during shipping, during integration with other circuitry, or during a customization process carried out by an end-user, for example.

In an illustrative embodiment, the mode selection circuitry 114 operates in conjunction with a micro-sequencer 220 to step through alternative locations within a microprogram stored within micro-store circuitry 222, depending upon the mode of operation set within the mode circuitry 114. The microprogram coded within the microstore 222 operates control circuitry 224 to access memory cells within the array 200 according to the operation (e.g. READ or WRITE), to data (e.g. 00, 01, 10, or 11), and according to the memory's operational mode (e.g. binary storage or quaternary storage). Several sets of microprogram may be provided where parallel operation of different portions of the memory to different interfaces or timing sets is desired.

In an illustrative embodiment, the control circuitry 224 includes a digital-to-analog converter that controls the amount of current applied to an accessed memory cell. Operating the digital to analog converter according to the stored microprogram allows the memory to apply current pulses of different amplitudes, duration, shape, and frequency in order to affect a variety of access operations. Microprograms, microsequencers and their associated controllers are known and used, for example, in memory self tests. The use of digital to analog converters to produce varied current pulses in a programmable resistance memory is known and described, for example, in "A MULTI-LEVEL CELL BIPOLAR SELECTED PHASE-CHANGE MEMORY," presented by Ferdinando Dedeschi et al, at session 23 of the 2008 IEEE International Solid State Circuits Conference, which is hereby incorporated by reference.

In this illustrative embodiment a memory 200 is organized in an 8×8 array of 64 memory blocks 202. Each block includes an array of memory cells 204 and peripheral circuitry that includes column 206, and row 208 access circuitry that provide access to individual memory cells 210 within each block 202. Peripheral array circuitry 212 includes row and column decoders and drivers, data and address buffers, sense amplifiers and current sources. The peripheral array circuitry 212 provides top-level decoding for access to the memory blocks 202, and switches/enables the appropriate read- or write-buffers, sense amplifiers, and current sources into a selected memory block 202.

In an illustrative embodiment at least one programming mode includes four or more program states and one programming mode includes two program modes. All, or part, of the memory may be configured by Mode to operate in any of the program states. A memory in accordance with the principles of the present invention may include different segments of memory types, some more suited to multi-level operation (that is, more than two storage levels), some more suited to binary operation(an operation that employs two storage levels, typically referred to as SET and RESET). The different types of memory segment may be optimized for their respective preferred mode of operation (e.g., multi-level or binary) through use of different phase change material compositions, different cell types, or different cell structures, for example. The Mode maybe hard-wired by use of a non-volatile approach such as bond, laser fuse blowing, or through a soft-wire technique, such as use of an electronic key loaded upon power up, such as from the I/O and stored in volatile or non-volatile on-chip memory.

In accordance with the principles of the present invention, each memory segment or block (by address range or sector) may be configured by Mode to operate in a plurality of program modes, such as binary, or different degrees of multi-level operation such as 4 levels per memory cell (2 logical bits per physical memory cell). Alternately, the analog signal from the memory array (that is, the signal, such as a voltage signal, that is representative of a memory cell's programmed level) may be provided to an external circuit (either directly to a pin or through an analog-to-digital converter), and the Mode control circuit 114 may control external reading and writing.

Additionally, one or more parts of the memory may be allocated by the Mode control circuit 114 to be run in parallel with error correction circuitry (ECC), under the control of the Mode control circuit 114. In this manner, extra memory used in ECC may be freed up when not needed for ECC, and the timing run faster for read and write when the Mode control circuit 114 disables the ECC.

In three-dimensional phase change memory embodiments, in which phase change memory elements may be stacked in layers, one upon one another, different layers or segments of different layers may be configured for operation in different program modes by Mode control circuit 114. Three-dimensional, stacked phase change memory structures are known and disclosed, for example, in U.S. Pat. No. 6,795,338, entitled "Memory Having Access Devices Using Phase Change Material Such As Chalcogenide," which is hereby incorporated by reference.

In operation, current source(s) within the peripheral circuitry program a selected cell to a resistance value corresponding with one of the levels associated with a given program mode (e.g., SET or RESET for a binary program mode, SET, RESET or one of two intermediate levels for a quaternary program mode, or Set Reset and one of more than two intermediate levels). The logic level diagram of FIG. 3A depicts the two levels employed in a binary program mode as two resistance values R1 (SET) and R2 (RESET). The program levels R1 and R2 are assigned ranges in order to accommodate variation among cells within a memory. In this illustrative embodiment, a first range RA1 includes resistances from above the nominal resistance R1 down to zero resistance and the second range RA2 includes resistances from slightly below the nominal resistance R2 to the highest measurable resistance.

In this illustrative embodiment, the starting points of ranges RA1 and RA2 may be selected so as to leave an undefined range RAun, which may be minimized or eliminated for two level storage. The starting points of the ranges RA1 and RA2 are chosen to ensure that all valid resistance measurements fall within one of the ranges and that any resistance measurement that falls within the undefined range RAun is invalid. Statistical resistance distributions may be employed to properly set the ranges RA1, RA2, and RAun.

The logic-level diagram of FIG. 3B depicts the resistance values associated with a quaternary logic level program mode such as may be employed in a multi-mode memory in accordance with the principles of the present invention. In this illustrative embodiment the quaternary program mode includes four nominal resistance values R3, R4, R5, and R6, with respective associated ranges RA3, RA4, RA5, and RA6. In this illustrative embodiment, nominal resistance value R3 may be the same resistance value as resistance value R1 of the binary mode of FIG. 3A and nominal resistance value R6 may be about the same resistance value as resistance value R2 of the binary mode of FIG. 3A. Additionally, ranges RA3 and RA6 may be the same ranges, respectively, as ranges RA1 and RA2 of the binary-mode depicted in FIG. 3A. Using the same resistance levels and ranges in this manner may ease the task of assigning logic levels to measured resistance values when operating in one of a plurality of possible modes.

In this illustrative embodiment ranges RA5 and RA6, associated with resistance levels R5 and R6 respectively, divide the range RAun of FIG. 3A. For phase change memory, the range of lower resistance assigned RA4 may be less than the range assigned RA5. In accordance with the principles of the present invention, the ranges and resistance values may be distributed in a different manner; the ranges and resistances in a quaternary mode needn't duplicate the ranges or resistances of a binary mode. Additionally, ranges and resistances need not be evenly distributed throughout the overall resistance range; it may be advantageous to concentrate nominal resistance levels at either end or towards the middle of the available resistance distribution, for example. As a further example, the intersection of RA5 and RA4 in FIG. 3B may be the intersection also used to demarcate the range of resistance RA1 and RA2 in FIG. 3A. This provides more operating region for a Set and Reset bit.

In operation, the peripheral circuitry 212 of FIG. 2 assigns logic values to measured resistance values read from or written to the memory cells, and makes those logic values available to circuits that access the memory 200. In an illustrative embodiment, the peripheral circuitry 202 includes sense amplifiers and comparators that perform the logic level assignment function. In such an embodiment a sense amplifier provides a voltage signal, corresponding to the resistance of a memory cell being read, to a bank of comparators that delimit the ranges RA1-RA6.

Figures 4A, 4B:
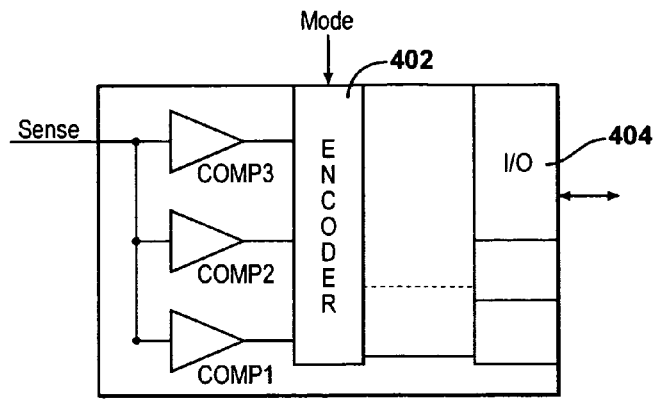
FIG. 4A is a block diagram of a mode-controlled encoder in accordance with the principles of the present invention.
FIG. 4B is a mapping of resistance to logic values such as may be implemented by an encoder in accordance with the principles of the present invention.

The conceptual block diagram of FIG. 4A provides a more detailed view of data conversion circuitry such as may be included within the peripheral circuitry 212 of a multi-mode memory in accordance with the principles of the present invention. In this illustrative embodiment logic level assignment circuitry 400 includes comparators COMP1, COMP2, and COMP3 and an encoder 402. The comparators are configured to receive a signal from a sense amplifier connected to a selected memory cell. The outputs of the comparators are presented to the encoder 402, which assigns logic values according to the list of FIG. 4B. A "MODE" input to the encoder controls the assignment of logic values (e.g., binary or quaternary).

The mode input also determines the number of data bits driven by the assignment circuitry 400 to input/output circuitry 404. That is, the assignment circuitry 400 drives one data line to the Input/Output circuitry 404 in the binary mode of operation and two data lines in the quaternary mode of operation. Similarly, address decoding circuitry within the peripheral circuitry 212 is responsive to the "MODE" input by accessing two cells within the memory array 200 for every "two bits" of data in the binary mode of operation, but accessing only one cell within the memory array for "two bits" of data in the quaternary mode of operation. For binary Mode, the undefined ranges R4 and R5 may be instead allocated to a 0 or 1 (that is, adjusted to provide more margin for variation or noise in the resistance during subsequent reads).

The use of a Mode control, such as embodied by mode control circuit 114 may engage different timing and write algorithms appropriate to personalize the chip, timing and drivers to allow use of different sections or layers of the memory as one-time programmable memory (OTP) (with, for example, a diode in series with a breakdown layer), or with binary on one section or layer, quaternary on another section or layer, or other, "n-ary" on another section or layer. Additionally, Nand-Flash, Nor-Flash, DRAM, or SRAM may be located on the first level and engaged in parallel with phase change memory on one or more layers above. The one or more phase change memory layers may be configured in series with Ovonic Threshold Switches (OTS) or thin film diodes (or OTP using a diode and breakdown layer) devices on the first level.

Certain segments or layers using a binary mode may use PCM deposited alloys that are faster with faster timing sets appropriately selected by Mode for those layer or sections of the memory. Similarly, other sections or layers may be quaternary and use a composition referred to as GST 225 as the memory alloy, with the appropriate time set selected from those available in micro-code and selectable by Mode for the memory map. Such approaches allow a hierarchy of memory on the chip selectable with little or no mask changes, with personalization by Mode and alloy deposited (or breakdown layer for OTP).

A portion of the memory may, for example, emulate DRAM and another portion on the same chip may emulate Nand flash, such as used in a solid state disc, SD Card, or USB memory card. The portions of the memory may be operated in parallel, or one in conjunction with the other. That is, the slower USB memory may be downloaded to the faster DRAM-like portion, with the faster DRAM portion interfacing (read and/or write) to the computer using DRAM-like interfacing (eg DDR). Once the faster memory addresses are no longer frequently used, the memory there may be uploaded to the slower memory and another block downloaded to the faster memory. A direct interface to each section of memory may be operated in parallel to off chip logic, or the interface may be through the faster memory only, with the interface to the slower memory through the faster memory (by down- or up-loading to it).

Figure 5:
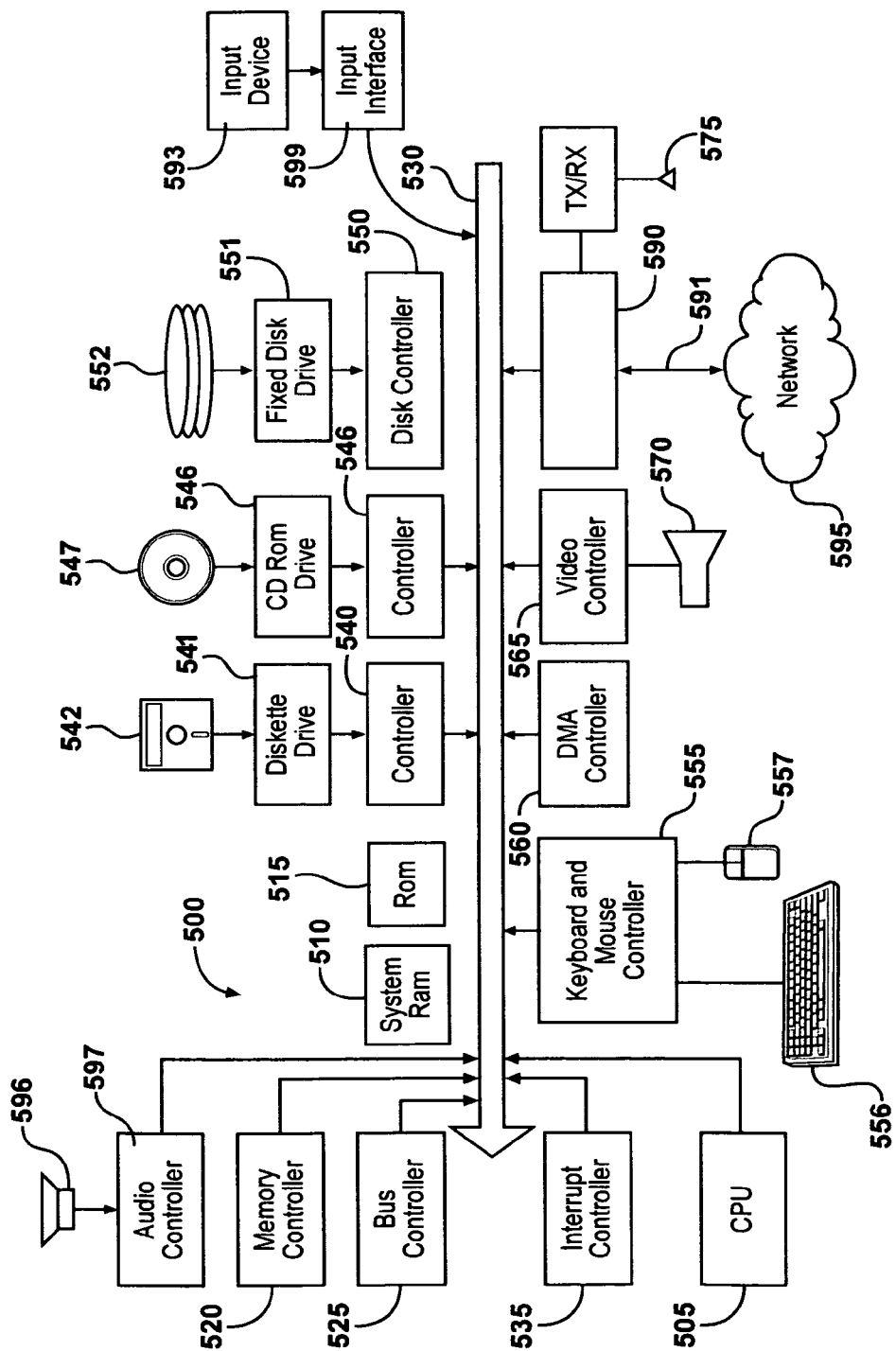
FIG. 5 is a conceptual block diagram of an electronic device that employs a phase change memory in accordance with the principles of the present invention.

The phase change electronic device(s) described in the discussion related to the previous figures may be employed to particular advantage in a wide variety of systems. The schematic diagram of FIG. 5 will be discussed to illustrate the devices' use in a few such systems. The schematic diagram of FIG. 5 includes many components and devices, some of which may be used for specific embodiments of a system in accordance with the principles of the present invention and while others not used. In other embodiments, other similar systems, components and devices may be employed. In general, the system includes logic circuitry configured to operate along with phase change memory. The logic circuitry may be discrete, programmable, application-specific, or in the form of a microprocessor, microcontroller, or digital signal processor, for example. And the embodiments herein may also be employed within the chips or connected to such circuitry. The exemplary system of FIG. 5 is for descriptive purposes only. Although the description may refer to terms commonly used in describing particular computer, communications, tracking, and entertainment systems, the description and concepts equally apply to other systems, including systems having architectures dissimilar to that illustrated in FIG. 5. The electronic system 500, in various embodiments, may be implemented as, for example, a general purpose computer, a router, a large-scale data storage system, a portable computer, a personal digital assistant, a cellular telephone, an electronic entertainment device, such as a music or video playback device or electronic game, a microprocessor, a microcontroller, a digital signal processor, or a radio frequency identification device. Any or all of the components depicted in FIG. 5 may employ a phase change memory or chalcogenide electronic device, such as a chalcogenide-based nonvolatile memory and/or threshold switch, for example.

In an illustrative embodiment, the system 500 may include a central processing unit (CPU) 505, which may be implemented with some or all of a microprocessor, a random access memory (RAM) 510 for temporary storage of information, and a read only memory (ROM) 515 for permanent storage of information. A memory controller 520 is provided for controlling RAM 510. In accordance with the principles of the present invention, all of, or any portion of, any of the memory elements (e.g. RAM or ROM) may be implemented as chalcogenide-based nonvolatile memory.

An electronic system 500 in accordance with the principles of the present invention may be a microprocessor that operates as a CPU 505, in combination with embedded chalcogenide-based electronic nonvolatile memory that operates as RAM 510 and/or ROM515, or as a portion thereof. In this illustrative example, the microprocessor/chalcogenide-nonvolatile memory combination may be standalone, or may operate with other components, such as those of FIG. 5 yet-to-be described.

In implementations within the scope of the invention, a bus 530 interconnects the components of the system 500. A bus controller 525 is provided for controlling bus 530. An interrupt controller 535 may or may not be used for receiving and processing various interrupt signals from the system components. Such components as the bus 530, bus controller 525, and interrupt controller 535 may be employed in a large-scale implementation of a system in accordance with the principles of the present invention, such as that of a standalone computer, a router, a portable computer, or a data storage system, for example.

Mass storage may be provided by diskette 542, CD ROM 547, or hard drive 552. Data and software may be exchanged with the system 500 via removable media such as diskette 542 and CD ROM 547. Diskette 542 is insertable into diskette drive 541 which is, in turn, connected to bus 530 by a controller 540. Similarly, CD ROM 547 is insertable into CD ROM drive 546 which is, in turn, connected to bus 530 by controller 545. Hard disc 552 is part of a fixed disc drive 551 which is connected to bus 530 by controller 550. Although conventional terms for storage devices (e.g., diskette) are being employed in this description of a system in accordance with the principles of the present invention, any or all of the storage devices may be implemented using chalcogenide-based nonvolatile memory in accordance with the principles of the present invention. Removable storage may be provided by a nonvolatile storage component, such as a thumb drive, that employs a chalcogenide-based nonvolatile memory in accordance with the principles of the present invention as the storage medium. Storage systems that employ chalcogenide-based nonvolatile memory as "plug and play" substitutes for conventional removable memory, such as disks or CD ROMs or thumb drives, for example, may emulate existing controllers to provide a transparent interface for controllers such as controllers 540, 545, and 550, for example.

User input to the system 500 may be provided by any of a number of devices. For example, a keyboard 556 and mouse 557 are connected to bus 530 by controller 555. An audio transducer 596, which may act as both a microphone and/or a speaker, is connected to bus 530 by audio controller 597, as illustrated. Other input devices, such as a pen and/or tabloid may be connected to bus 530 and an appropriate controller and software, as required, for use as input devices. DMA controller 560 is provided for performing direct memory access to RAM 510, which, as previously described, may be implemented in whole or part using chalcogenide-based nonvolatile memory devices in accordance with the principles of the present invention. A visual display is generated by video controller 565 which controls display 570. The display 570 may be of any size or technology appropriate for a given application.

In a cellular telephone or portable entertainment system embodiment, for example, the display 570 may include one or more relatively small (e.g. on the order of a few inches per side) LCD displays. In a large-scale data storage system, the display may be implemented as large-scale multi-screen, liquid crystal displays (LCDs), or organic light emitting diodes (OLEDs), including quantum dot OLEDs, for example.

The system 500 may also include a communications adaptor 590 which allows the system to be interconnected to a local area network (LAN) or a wide area network (WAN), schematically illustrated by bus 591 and network 595. An input interface 599 operates in conjunction with an input device 593 to permit a user to send information, whether command and control, data, or other types of information, to the system 500. The input device and interface may be any of a number of common interface devices, such as a joystick, a touch-pad, a touch-screen, a speech-recognition device, or other known input device. In some embodiments of a system in accordance with the principles of the present invention, the adapter 590 may operate with transceiver 573 and antenna 575 to provide wireless communications, for example, in cellular telephone, RFID, and wifi computer implementations.

Operation of system 500 is generally controlled and coordinated by operating system software. The operating system controls allocation of system resources and performs tasks such as processing scheduling, memory management, networking, and I/O services, among other things. In particular, an operating system resident in system memory and running on CPU 505 coordinates the operation of the other elements of the system 500. In illustrative handheld electronic device embodiments of a system 500 in accordance with the principles of the present invention, such as a cellular telephone, a personal digital assistance, a digital organizer, a laptop computer, a handheld information device, a handheld entertainment device such as a device that plays music and/or video, small-scale input devices, such as keypads, function keys and soft keys, such as are known in the art, may be substituted for the controller 555, keyboard 556 and mouse 557, for example. Embodiments with a transmitter, recording capability, etc., may also include a microphone input (not shown).

In an illustrative RFID transponder implementation of a system 500 in accordance with the principles of the present invention, the antenna 575 may be configured to intercept an interrogation signal from a base station at a frequency $F_1$. The intercepted interrogation signal would then be conducted to a tuning circuit (not shown) that accepts signal $F_1$ and rejects all others. The signal then passes to the transceiver 573 where the modulations of the carrier $F_1$ comprising the interrogation signal are detected, amplified and shaped in known fashion. The detected interrogation signal then passes to a decoder and logic circuit which may be implemented as discrete logic in a low power application, for example, or as a microprocessor/memory combination as previously described. The interrogation signal modulations may define a code to either read data out from or write data into a chalcogenide-based nonvolatile memory in accordance with the principles of the present invention. In this illustrative embodiment, data read out from the memory is transferred to the transceiver 573 as an "answerback" signal on the antenna 575 at a second carrier frequency $F_2$. In passive RFID systems power is derived from the interrogating signal and memory such as provided by a chalcogenide-based nonvolatile memory in accordance with the principles of the present invention is particularly well suited for such use.

For some use of the embodiments herein, the Controller 540 or CPU may send an electronic key to the Memory Controller or System memory such as Ram 510 or Rom 515, changing the memory from binary to quaternary so that the amount of memory is doubled but the timing used is slower (such as 2× for read, and 10× for write). Such a change may be done in the field under electronic control driving the Mode 114, such as use of an electronic key, or by changing the connection of certain pins to the Mode 114.

Figure 6:
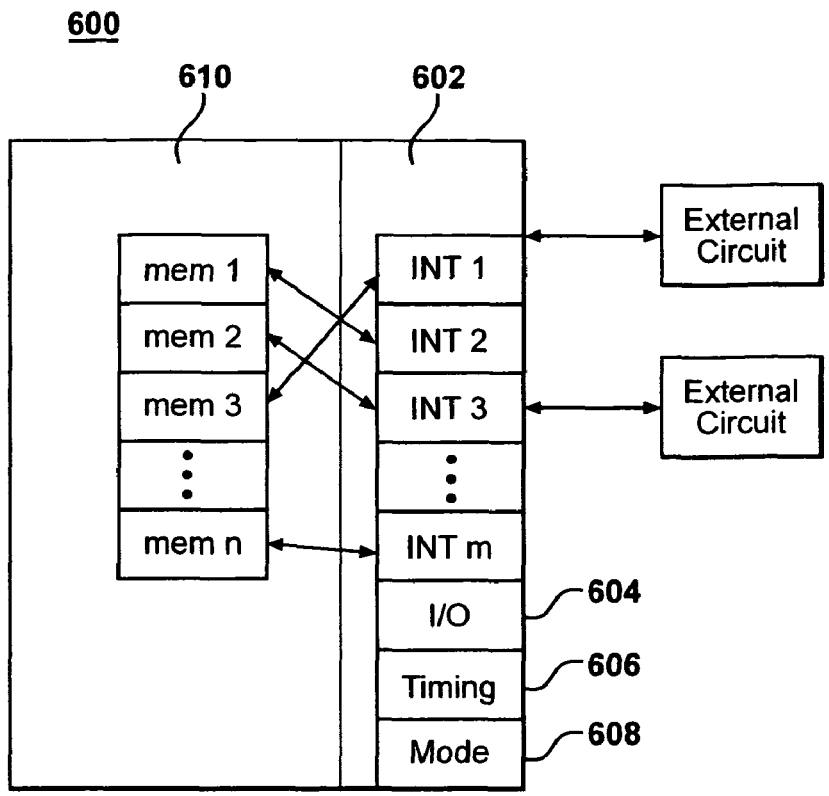
FIG. 6 is a conceptual block diagram of a multimode memory including an interface in accordance with the principles of the present invention.

A multi-mode programmable resistance memory 600 in accordance with the principles of the present invention may accommodate one or more standard interfaces and thereby be plug-in compatible for one or more existing applications and systems. The conceptual block diagram of FIG. 6 illustrates functional components of a multi-mode memory 600 in accordance with the principles of the present invention. In this illustrative embodiment the memory 600 includes an interface 602 which operates in conjunction with input/output 604, timing and control 606, and mode control 608 components to provide an interface between a multi-mode memory 610 and external circuitry 612. The multi-mode memory 610 may divided into segments MEM1, MEM2, MEM3, . . . MEMn, and each segment may be configured for operation in a different mode. The memory segments MEM1, MEM2, MEM3, . . . MEMn, may share a physical layer or may be distributed on different layers of a multi-layer memory.

The interface 602 may be a relatively simple, fixed, interface that is compatible with an existing memory interface. For example, the interface may include facility for multiplexed address lines and be responsive to Row Address Strobe and Column Address Strobe signals generated for Dynamic Random Access Memory. Similarly, the interface may also include, for example, other signals such as a ready/busy signal to indicate when a write (or search) is completed in order to provide compatibility with FLASH memory (NOR or NAND); that is, a Flash compatible interface. A Solid State Drive (SSD) interface may include such things as a lookup table interface, a sector fetch facility, or wear leveling, for example. A Synchronous Dynamic Random Access Memory (SDRAM) interface may include a system clock for synchronous accesses to memory. A Double Data Rate (DDR, including DDR1, DDR2, . . . DDRn) interface may include signaling that allows memory to be accessed on both the rising and falling edge of a clock, for example. The interface 602 may include the physical signaling necessary for each type of interface supported. The interfaces provided may be accessed one at a time or in parallel, with I/o ports provided for parallel access to the various types of memory via the various types of interfaces supported by the chip. Diagramatically in FIG. 6 and 7, one External Circuitry block is shown. However, the various interfaces and I/O ports may operate in parallel to one or more sets of external circuitry, either directly, in parallel, or by multiplexer (to save pins and wires).

The variety of interfaces provided is indicated by interfaces INT1, INT2, INT3, . . . INTm. The interface 602 may employ any one or more of the interface types INT1, INT2, INT3, . . . INTm for the entire memory 610, thereby configuring the entire memory 610 as a DRAM, SDRAM, NOR FLASH, NAND FLASH, DDR, or SSD, for example. Alternatively, the interface may be reconfigurable, allowing the memory to be configured for operation as any of a variety of memory types, either as only one type at a time or as more than one type in parallel by operating the interfaces and I/O in parallel. In accordance with the principles of the present invention, a memory and interface in accordance with the principles of the present invention may allow segments of memory to be reconfigured to operate in different modes (e.g., binary, ternary, quaternary, etc.) and for different segments to be accessed using different interfaces. For example, a segment configured in a binary mode may be accessed using an SDRAM interface, a segment configured in a ternary mode may be accessed using a DRAM interface, a segment configured in a quaternary mode may be accessed using an SSD interface. In accordance with the principles of the present invention, any combination of memory segments, operational modes, and interfaces may be employed.

Because a memory in accordance with the principles of the present invention may operate in more than one mode, the Interface 602 may manipulate the input/output 604 and timing and control 606 components to accommodate those components to whatever interface may be used. For example, if the memory 600 may be configured to operate in either a binary or quaternary storage mode and the quaternary storage mode requires more access time than the binary storage mode, the interface 602 may adjust the configuration of the timing and control 606 and input/output 604 components to accommodate those timing differences. The interface 602 may perform this accommodation on a "chip-wide" basis, or it may do so on a sector-by-sector basis, for example, devoting a portion of one or more physical layers to high-speed binary operation (with, for example, a corresponding DRAM or SDRAM or SRAM or Nor Flash physical and functional interface) and devoting the remainder of the memory to lower-speed multi-level operation (with, for example, a corresponding Nand FLASH or SSD or SD Card physical and functional interface). Alternatively, the interface accommodation may be on a layer-by-layer basis with, for example, a bottom physical layer configured for high-speed, binary, operation with a DRAM, SDRAM, or DDR functional and physical interface underlying layers devoted to lower-speed multi-level operation with a corresponding FLASH or SSD or SD Card or USB memory physical and functional interface, for example.

As with the mode control input, the interface selection means may be implemented on or off the multi-mode memory chip, using a nonvolatile mechanism and the interface selection may be memory-mapped, with the various storage modes and interface signaling responsive to assigned address ranges. The interface(s) provided by a multi-mode programmable resistance memory in accordance with the principles of the present invention may include signaling that indicates to external circuitry the status of mode and interface settings for different segments of the memory.

Figure 7:
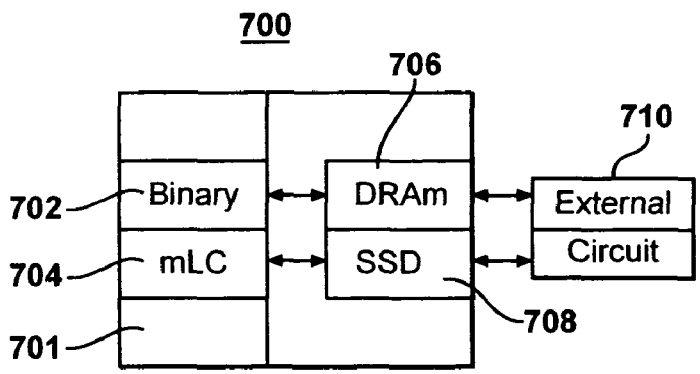
FIG. 7 is a conceptual block diagram of an embodiment of a multimode memory including an interface in accordance with the principles of the present invention.

In the illustrative embodiment of FIG. 7 a multi-mode programmable resistance memory 700 in accordance with the principles of the present invention includes binary mode 702 and MLC mode 704 programmable resistance memory and corresponding interfaces for DRAM 706 (e.g., SDRAM, DDR, etc.) and SSD 708. The interfaces 706, 708 provide access between external circuitry 710 and the memory 701 in a manner that takes advantage of the mode of each of the memory segments 702, 704. In this illustrative embodiment the binary mode programmable resistance memory is configured as a buffer that operates as a high-speed cache between external circuitry 710 (which may include a microprocessor) accessing the memory, and lower-speed MLC mode programmable resistance memory.

The illustrative interfaces may, for example, perform the functions of an SSD controller, yielding an interface that appears to external circuitry (that is, to circuitry located outside the boundaries of the programmable resistance memory), to be an SSD. The SSD controller function may be implemented within the chip, within the substrate using conventional NMOS, PMOS, or CMOS processing, for example, or an external controller chip may be placed between the memory chip 700 and the external circuitry 710. In an illustrative embodiment, the SSD controller function may be implemented in a conventional crystalline substrate, with multiple layers of programmable resistance memory formed on top of the SSD controller substrate. Multi-layered, or stacked, programmable resistance memories are known in the art and described, for example, in published U.S. patent application Ser. No. 11/202,428 entitled "SHARED ADDRESS LINES FOR CROSSPOINT MEMORY," which is hereby incorporated by reference. In an illustrative embodiment, the interface 602 includes interface and mode signals which indicate the mode and type interface employed with various sections of the memory. Such signals may be incorporated in a memory map register of the programmable resistance memory or located off-chip to drive/control the appropriate timing interface on-chip, for example. In an illustrative embodiment the SSD interface 708 (including SSD controller) operates to shuttle data between the binary and MLC mode memory segments just as a SSD controller would operate to move data among relatively high and low speed memories.

A multi-mode programmable resistance memory in accordance with the principles of the present invention may be configured to operate as a single-chip system memory. In such an embodiment, the multi-mode programmable resistance memory may include sufficient quantity and types of memory to replace, for example, the fixed disk 552, system RAM 510, and system ROM 515 of FIG. 5. Additionally, the single crystal substrate may include circuitry to emulate the operations of the disk controller 550, DMA controller 560, and memory controller 520, for example.

Figure 8:
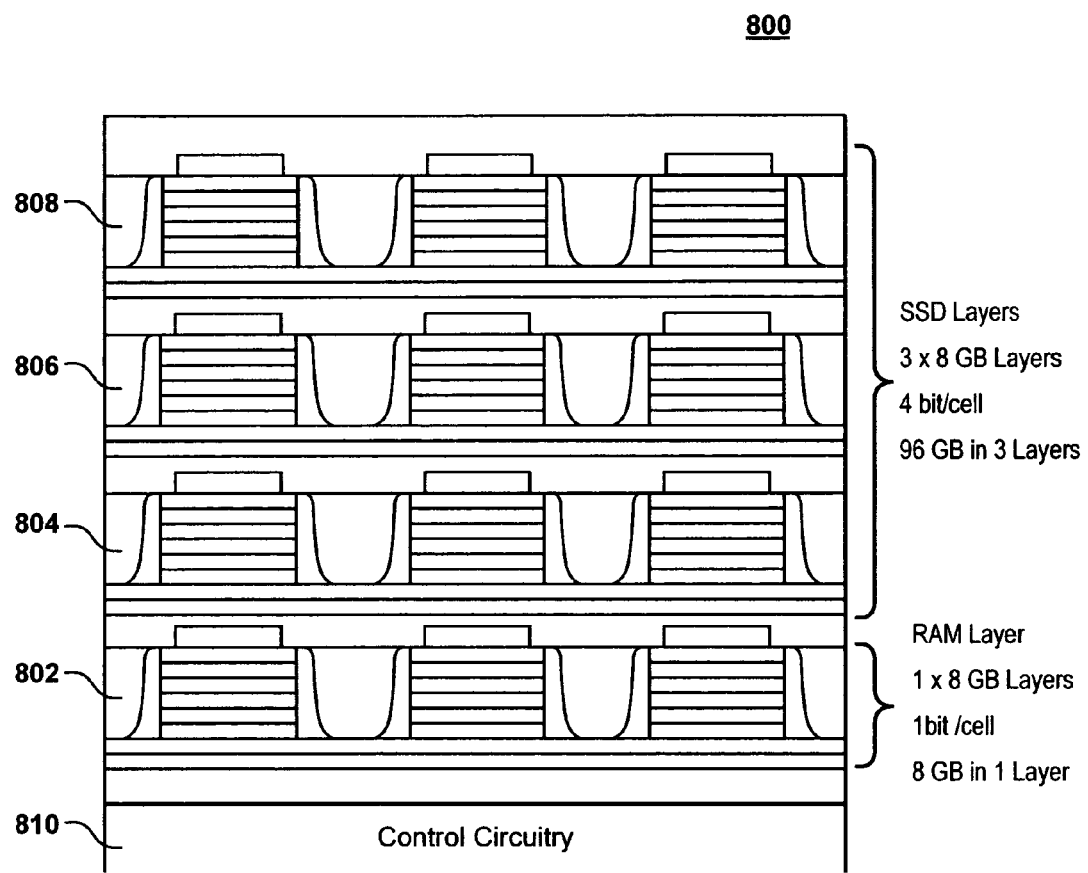
FIG. 8 is a sectional view of an illustrative embodiment of a multilayered memory in accordance with the principles of the present invention.

In the illustrative embodiment of FIG. 8 a multi-mode programmable resistance memory 800 in accordance with the principles of the present invention includes four layers (802, 804, 806, and 808) of multimode programmable resistance memory formed on a single-crystal substrate 810. The single-crystal substrate 810 may include NMOS, PMOS, or CMOS circuitry, for example and, in this illustrative embodiment, includes control circuitry that provides an interface to the memory of layers 802, 804, 806, and 808; though part or all of such interface circuitry may be located off-chip in a controller. Each of the four layers physically includes 64 giga-cells (that is, $64 \times 2^{30}$ memory cells). One of the four layers (the bottom one in this illustrative embodiment) is configured to operate in a binary mode, yielding 8 gigabytes (GB) of relatively high-speed storage. The other three layers of multi-mode programmable resistance memory are configured to operate in a sixteen-level mode (four logical bits per physical cell), yielding 32 GB (32 giga-bytes) per layer. Thus, the 3 layers provide 96 GB of slower, multilevel, storage. The total on-chip memory provided in this mode allocation of the multi-mode chip are 96 G-Bytes of slower storage and 8 G-Bytes of higher speed two-level memory. In this illustrative embodiment, the 8 GB of two-level (1-bit) memory may be configured to operate as a RAM cache for the 96 GB of sixteen-level (4-bit) memory, which may be, for example, configured as or emulate an SSD. In this manner, a memory in accordance with the principles of the present invention provides hierarchy multi-part system memory for a system such as that disclosed in the discussion related to FIG. 5, in a single integrated circuit. The physical memory described in this example may be larger or smaller, and may employ more or less bits/byte to, for example, support more or less ECC (Haming style) error correction. The memory may be organized triple modular redundant for fail soft, by providing 3 way redundancy and voting to determine bit state. Or, more efficiently in the use of total bits, the memory may be organized in sectors and support learning information stored with a sector and/or fire codes for complimentary forms of error correction, using means and alternatives that will be apparent to those reasonably skilled in the art.

In accordance with the principles of the present invention, different memory layers, such as layers 802 through 808 in FIG. 8, may employ alloys of different compositions. For example, in a phase change memory embodiment, different memory layers may include memory cells that employ different phase change materials, such as different chalcogenide alloys. The selected alloys may be chosen on the basis of their operational characteristics; one or more layers may employ an alloy that is particularly well-suited to high speed operation; one or more of the layers may employ an alloy that is particularly well-suited to long term storage; one or more layers may employ an alloy that exhibits greater or shorter retention; one or more layers may employ an alloy that is well-suited to binary operation, and one or more layers may employ an alloy that is well-suited for MLC operation, for example.

In an illustrative embodiment, one layer of memory is configured to operate in a binary mode and other layers are configured to operate in an MLC mode. Because binary operation generally requires fewer steps or overhead time in the reading, writing, encoding, and decoding processes, binary operation is typically faster than MLC operation in that multiple write, read, write to adjust, re-read types of steps may be avoided. And, as previously described, binary mode memory may be operated, for example, as a high-speed cache for MLC mode memory operated as an SSD. By employing a high-speed alloy, the speed of the one or more layers (or segments) dedicated to binary mode operation may be further accelerated. In an illustrative embodiment, a high speed alloy is an alloy that, when employed in a programmable resistance memory, may be SET within 50 ns. In another embodiment, a high speed alloy is one that, when employed in a programmable resistance memory, may be SET within 20 ns. In another embodiment, a high speed alloy is one that, when employed in a programmable resistance memory, may be SET within 10 ns. In an illustrative embodiment, a high data retention alloy is one that, when employed in a programmable resistance memory, retains data for at least one day. In another embodiment, a high data retention alloy is one that, when employed in a programmable resistance memory, retains data for at least one year. In another embodiment, a high data retention alloy is one that, when employed in a programmable resistance memory, retains data for at least ten years. In an illustrative embodiment, a low temperature alloy is an alloy, the melting temperature of which is less than 500 C. In another embodiment, a low temperature alloy is an alloy, the melting temperature of which is less than 450 C. In another embodiment, a low temperature alloy is an alloy, the melting temperature of which is less than 400 C.

While not wishing to be bound by theory, it is believed that alloys with lower melting temperatures than the alloys previously disclosed herein (e.g. GST 225, Tm 615C) may provide for faster operation. Such lower melting temperature alloys include, Se20Sb20Te60 (Tm 396 C), Se10Sb20Te70 (Tm 402 C), and Se35Sb35Te30 (Tm 389 C), for example. One potential tradeoff for such high-speed, low melting-temperature, alloys is that the data retention of a memory device built around such an alloy may be substantially less than that of a memory fashioned of a higher melting temperature alloy such as GST 225. By employing both types of alloy, a memory in accordance with the principles of the present invention may provide both high speed access and long-term data retention. In accordance with the principles of the present invention, data may be stored in the high-speed memory for a relatively short period of time and, as in the previously described, cache/SSD example, shifted to the higher data retention segment of memory for longer-term storage.

We claim:

1. An apparatus, comprising:
a plurality of programmable resistance memory cells, each cell capable of operating in one of at least two different storage modes;
a mode controller configured to accept input regarding a selected storage mode and to indicate to memory access circuitry the selected storage mode, the memory access circuitry configured to access the memory cells according to the selected storage mode; and
an interface configured to further access the memory in conformance with a standard interface.

2. The apparatus of claim 1 wherein the standard interface is a dynamic random access memory (DRAM) interface.

3. The apparatus of claim 1 wherein the standard interface is a synchronous dynamic random access memory (SDRAM) interface.

4. The apparatus of claim 1 wherein the standard interface is a double data rate (DDR) interface.

5. The apparatus of claim 1 wherein the standard interface is a FLASH interface.

6. The apparatus of claim 1 wherein the standard interface is an solid a solid state drive (SSD) interface.

7. The apparatus of claim 1 wherein the interface includes a plurality of standard interfaces, including a relatively high-speed and a relatively low-speed interface.

8. The apparatus of claim 7 wherein the memory accessed by the relatively high speed interface is configured to act as a cache for memory accessed by the relatively low speed interface.

9. The apparatus of claim 8 wherein memory accessed by a DRAM interface is configured to act as a cache for memory accessed by an SSD interface.

10. The apparatus of claim 9 wherein the memory includes an SSD controller.

11. The apparatus of claim 7 wherein the memory is configured as a system memory contained in a single integrated circuit.

12. The apparatus of claim 7 wherein the memory includes more than two layers of memory, with one layer configured to operate in a binary mode and a plurality of layers configured to operate in a multi-level mode (MLC).

13. The apparatus of claim 12 wherein the memory employs an SSD with the MLC configured layers.

14. The apparatus of claim 13 wherein the memory includes at least one layer of binary mode memory comprising at least one giga-cells of binary mode memory and at least one layer comprising at least one giga-cells of multi-level memory.

15. The apparatus of claim 13 wherein the memory includes at least one layer of binary mode memory comprising at least sixteen giga-cells of binary mode memory and at least one layer comprising at least sixteen giga-cells of multi-level memory.

16. The apparatus of claim 13 wherein the memory includes at least one layer of binary mode memory comprising at least sixty-four giga-cells of binary mode memory and at least three layers comprising at least one hundred and ninety-two giga-cells of sixteen-level memory.

17. The apparatus of claim 1 wherein the memory is a phase change memory.

18. An electronic device, comprising:
- a plurality of programmable resistance memory cells, each cell capable of operating in one of at least two different storage modes;
- a mode controller configured to accept input regarding a selected storage mode and to indicate to memory access circuitry the selected storage mode, the memory access circuitry configured to access the memory cells according to the selected storage mode;
- an interface configured to further access the memory in conformance with a standard interface; and
- a microprocessor configured to initiate access of the mode selected memory cell.

19. The electronic device of claim 18 further comprising a transceiver configured to transmit mode data from for the mode selected memory.

20. The electronic device of claim 18 wherein the memory, microprocessor and transmitter/receiver are configured as a cellular telephone.

21. The electronic device of claim 18 wherein the memory and microprocessor are configured as a handheld entertainment device.

22. The electronic device of claim 18 wherein the memory and microprocessor are configured as a computer.

* * * * *